United States Patent [19]

van Dyk Soerewyn

[11] Patent Number: 5,078,082

[45] Date of Patent: Jan. 7, 1992

[54] METHOD AND APPARATUS FOR APPLYING BONDING MATERIAL TO A POPULATED MOUNTING SURFACE

[75] Inventor: Herman van Dyk Soerewyn, Peabody, Mass.

[73] Assignee: SMT East Corporation, Stoughton, Mass.

[21] Appl. No.: 394,629

[22] Filed: Aug. 16, 1989

[51] Int. Cl.⁵ .............................................. B05C 5/02
[52] U.S. Cl. ..................................... 118/213; 118/406
[58] Field of Search ............... 118/211, 213, 406, 415, 118/504; 228/33, 246; 101/123, 127.1

[56] References Cited

U.S. PATENT DOCUMENTS

| | | | |
|---|---|---|---|
| 3,919,973 | 11/1975 | Zimmer | 118/213 |
| 4,693,209 | 9/1987 | Leicht | 118/213 |
| 4,784,310 | 11/1988 | Metzger et al. | 228/123 |

Primary Examiner—Michael Wityshyn
Attorney, Agent, or Firm—Weingarten, Schurgin, Gagnebin & Hayes

[57] ABSTRACT

A method and apparatus are provided for applying a bonding material such as solder paste or conductive epoxy to a printed circuit board or other substrate surface upon which one or more other electrical components may already have been premounted. An exemplary embodiment of the invention includes a removable fixture having a screening surface which is generally shaped to conform to the area targeted on the circuit board and which contains holes prepositioned to correspond to electrical contacts of the electrical component to be mounted. The screening surface is connected to a holding frame by at least two vertical sides to allow easy placement of the screening surface on a populated or empty circuit board and to protect other mounted electrical components from damage or displacement during the screening process. The screening surface is placed on the targeted area of the circuit board, and solder is pushed across the screening surface by a squeegee and thereby coerced through the prepositioned holes and deposited onto the circuit board.

17 Claims, 3 Drawing Sheets

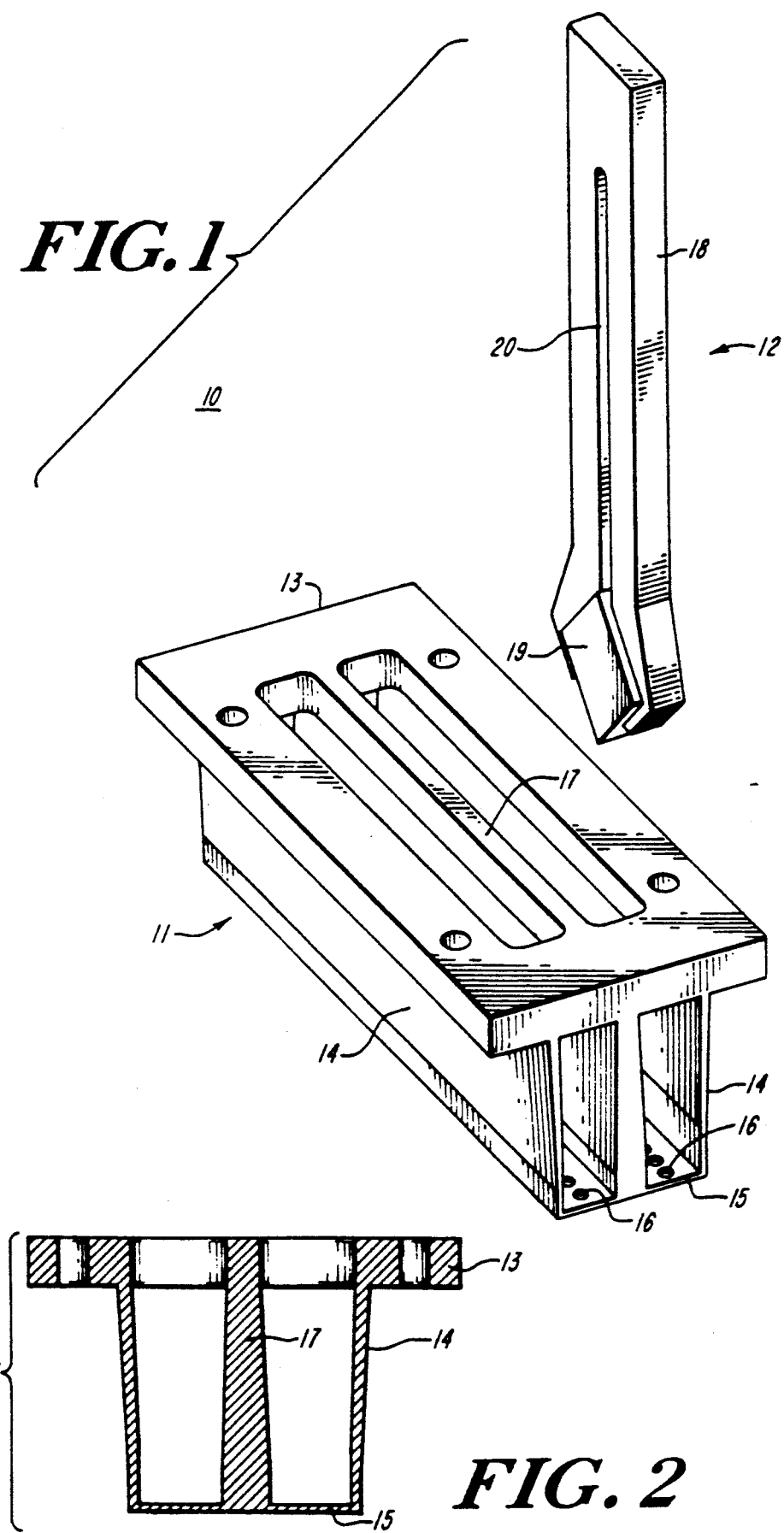

METHOD AND APPARATUS FOR APPLYING BONDING MATERIAL TO A POPULATED MOUNTING SURFACE

FIELD OF THE INVENTION

This invention relates to attaching electrical components to circuit boards and substrate surfaces, and in particular to the application of bonding material to a mounting surface which contains obstructions or which is already populated with premounted electrical components.

BACKGROUND OF THE INVENTION

It is well known in the art of mounting components on printed circuit boards that surface mounting technology (SMT) provides advantages in quickness of installation and practicality over the prior custom of mounting electrical components through holes on circuit boards. SMT eliminated the need for holes and, in many cases, the need for conductor leads, greatly diminishing the area required for each component. SMT thereby made possible further miniaturization. Bonding materials such as solder paste or conductive epoxy were usually applied to the contact areas on the circuit board before the components were placed thereon.

The application of the bonding material typically involves stamping, dispensing, or screening the bonding material onto the mounting surface. The stamping method requires the use of a pin, the end of which is dipped into the solder paste and then used to "stamp" the paste onto the contacts of the printed circuit board. The application is analogous to the common rubber date stamp used to print the date on a sheet of paper. The amount of paste is controlled by the size of the pin end and the thickness of the layer of paste on the "pad". The dispensing method, on the other hand, requires the use of a container having a piston and hypodermic tubing for squeezing solder paste or conductive epoxy onto the intended contact area. The amount of the paste is controlled by the diameter of the tubing, the pressure on the piston, and the duration of the squeezing. Finally, the screening technique requires the use of a fine mesh metal screen in which only target areas are permeable to the solder paste. The screen is positioned over the surface of the printed circuit board or substrate, and the solder paste is deposited onto the board through the permeable areas of the screen by pushing the paste across the screen with a squeegee. The screening method is by far the fastest and most precise way of applying solder paste or conductive epoxy to a printed circuit board or substrate for the extremely small contact areas of miniaturized electrical components, e.g., dual-in-line devices. The stamping or dispensing methods are not sufficiently precise for such applications because they tend to lead to "shorts" and "opens". In addition, these methods involve a slow and arduous process, especially in cases of components having numerous leads and contacts. The disadvantage of the screening method, however, is that it is primarily limited to applications involving flat surfaces such as printed circuit boards or substrates which are free from obstructions such as vertical pins, leads, or mounted components.

U.S. Pat. No. 4,784,310 provides a method for screen printing which works when another device is premounted on the circuit board. However, the screen must be precut to a sufficient size in a precise location relative to the area to be screen-etched. In other words, effort and planning are required to provide an aperture in the screen sufficient to avoid obstruction by the premounted device. A solder-impervious cap of a suitable size and height is then placed over the premounted device to protect it from damage or dislocation during the screening process. Thereafter, the application of solder paste is achieved with the use of a squeegee, which must ride over the protective cap. By this method, the patent avoids the need to reflux the pattern printed on the circuit board. However, if a further component is to be attached to the circuit board, the successive planning and preparation steps of the process must be repeated, since the additional mounted component will pose further obstruction problems and will require protection by a cap of sufficient size and height. If the board is populated with more than one component, substantial planning and effort are required to prepare the appropriate apertures and protective caps.

A need therefore exists for a fast, precise, and practical way to screen solder paste or conductive epoxy onto a circuit board which is populated with electrical components and which otherwise poses numerous difficulties of obstruction when the screening method is employed.

SUMMARY OF THE INVENTION

The present invention provides an apparatus and method for applying solder paste, conductive epoxy, or other bonding material to a printed circuit board, substrate, or other mounting surface which is populated with premounted electrical components or leads. The aforementioned disadvantages are avoided, because the invention permits a fast, precise, and practical way for screening the bonding material onto a targeted contact area on the populated or otherwise obstructed mounting surface without the danger of harming or dislodging nearby components. The screening element of the invention does not need precutting so as to conform to the size and location of obstructing, premounted devices; nor is a protective cap required.

An exemplary embodiment of the present invention includes a screening surface which is generally conformed to the targeted contact area and is therefore relatively smaller than prior screening apparatus. The screening surface may therefore be square, rectangular, triangular, or even circular to accommodate variously shaped electrical components and target contact areas on the mounting surface. The conformed design even permits non-planar application, so that the invention allows screening onto populated mounting surfaces which are flexed or curved in space. The small size of the invention allows its use on heavily-populated circuit boards and locations otherwise inaccessible to the screening method. The screening surface contains holes which are prepositioned in relation to the position of contact elements of the electrical component to be mounted. The thickness of the surface and size of the holes are variable according to a predetermined amount of solder to be deposited onto the mounting surface. The screening surface is attached to a holding frame by vertical sides which serve to prevent solder from spilling onto adjacent areas on the mounting surface and creating "shorts". Solder is deposited by placing the removable fixture over the desired contact area and pushing solder across the screening surface with a squeegee. The process may be repeated in other locations on the populated circuit board without steps taken to alter the screening surface or to install protective caps or masks on premounted components. The invention affords additional advantages through its compactness of size, efficiency of function, and ease of manufacture. The removable fixture, for example, may be stamped or machined from one piece of metal or plastic or assembled from several pieces.

DESCRIPTION OF THE DRAWINGS

The invention will be more fully understood from the following detailed description taken in conjunction with the accompanying drawings in which:

FIG. 1 is a perspective view of the removable fixture and of the applicator;

FIG. 2 is a cross-wise side elevation view of the removable fixture;

DETAILED DESCRIPTION OF THE INVENTION

Figure 3:
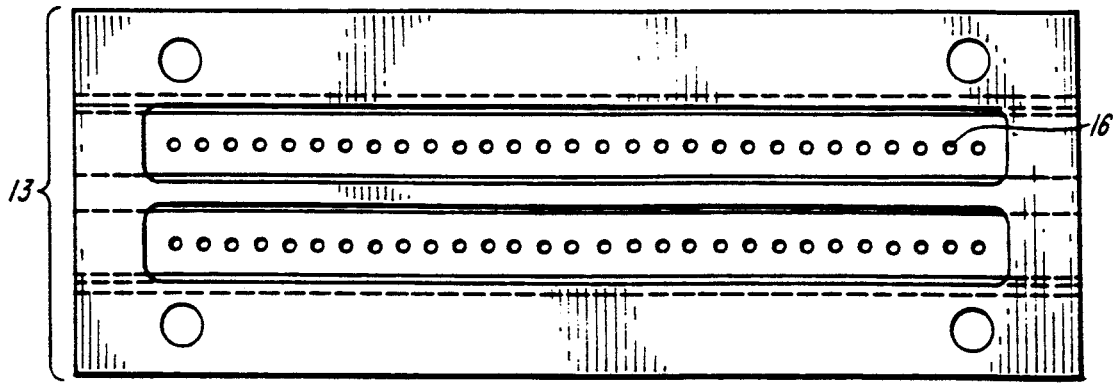
FIG. 3 is a top view version of FIG. 2.
Figure 4A:
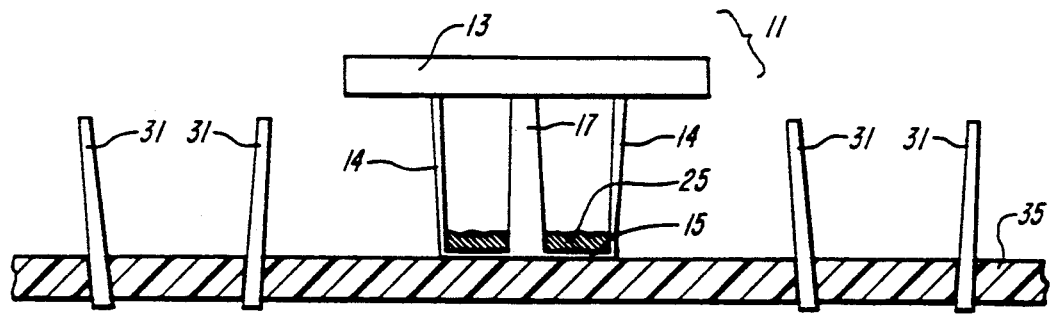
FIGS. 4a and 4b are respective end elevation views of the removable fixture placed upon a circuit board populated with leads and upon a circuit board with premounted electrical components.
Figure 4B:
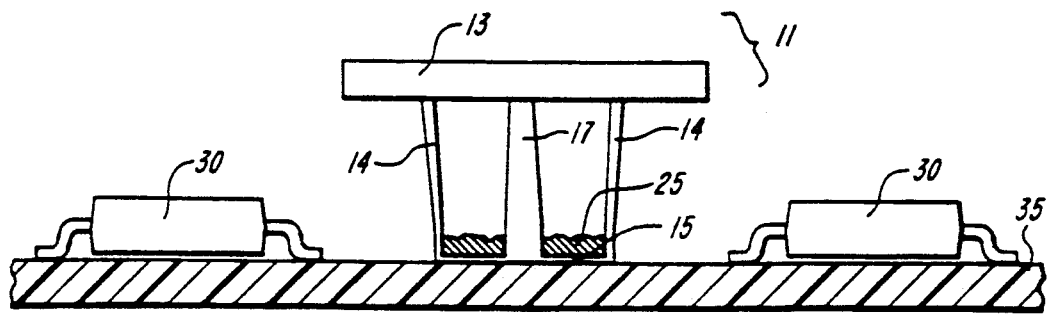
Figure 5:
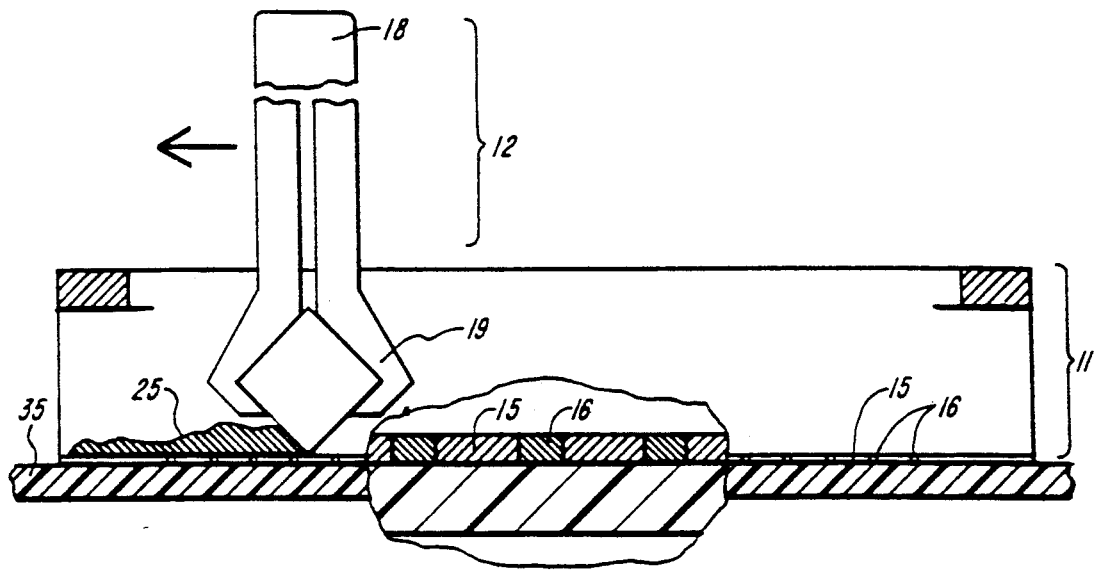
FIG. 5 is a side view of the removable fixture placed on a circuit board and the applicator pushing bonding material across the screening surface.

As referenced in the appended drawings, an exemplary embodiment of the invention provides an apparatus for applying bonding material such as solder paste or conductive epoxy onto a mounting surface such as a populated circuit board or other substrate. The apparatus 10 comprises a removable fixture 11 for screening bonding material 25 (FIGS. 4A, 4B and 5) onto a mounting surface and an applicator 12 for applying the bonding material 25 in conjunction with the removable fixture 11. The removable fixture 11 comprises a holding frame 13, at least two vertical side walls 14, and a screening surface 15 containing a plurality of holes 16 prepositioned in a location corresponding to the contact elements of the electrical component to be mounted. Where the holes 16 of the screening surface 15 are arranged in rows, a wall 17 may be used to separate the rows of holes 16 and to provide structural reinforcement to the removable fixture 11, as seen in FIG. 1. The invention may also be successfully used without the wall. The applicator 12 is used to push bonding material 25 onto the screening surface 15 and to coerce the bonding material 25 into the holes 16 contained therein for depositing bonding material 25 onto the mounting surface, as seen in FIG. 5. The applicator 12 includes a handle member 18 for easy manual manipulation, a groove to provide resilient means for clasping a squeegee end 19, typically polyurethane, for precise application of the bonding material 25. The squeegee end 19 may be shaped from a square or rectangular piece of polyurethane presenting an edge suitable for pushing bonding material 25 across the screening surface 15 and coercing it into the prepositioned holes 16 contained therein, as seen in FIG. 5. Instead of the polyurethane squeegee shown, a suitable sized metal squeegee may be used, consisting of a flexible blade type.

The screening surface 15 is conformed to the target contact area on the mounting surface. The screening surface 15 may be rectangular, square, circular, or of another shape in a size sufficient to contain holes arranged in a pattern which corresponds to the electrical contacts on the component to be mounted and to allow the removable fixture 11 to be placed among neighboring premounted components 30 or leads 31 on the mounting surface 35 without damaging or dislodging them, as seen in FIGS. 4a and 4b. The screening surface 15 may be non-planar, and shaped to conform to a target contact area on a mounting surface which is flexed or curved in space, such as a flex film. The thickness of the conformed screening surface 15 and size of the holes 16 contained therein are predetermined according to the amount of deposited solder paste or conductive epoxy desired. The compactness afforded by the screening surface 15 enables the removable fixture 11 to be placed onto mounting surfaces such as circuit boards 35 which are highly populated with electrical components or leads and which are otherwise obstructed, as seen in FIGS. 4a and 4b.

The removable fixture 11 contains at least two walls 14, as seen in FIG. 1. The shape of the removable fixture may therefore be perceptibly polygonal or even shaped into a circle having innumerable walls joined continuously in one piece around the screening surface. The walls 14 provide a means for containing the solder paste or conductive epoxy 25 which is pushed across the screening surface 15. The walls also provide a means for preventing spillage of solder paste or conductive epoxy onto adjacent areas or components on the mounting surface 35, as seen in FIGS. 4a and 4b.

Figure 6:
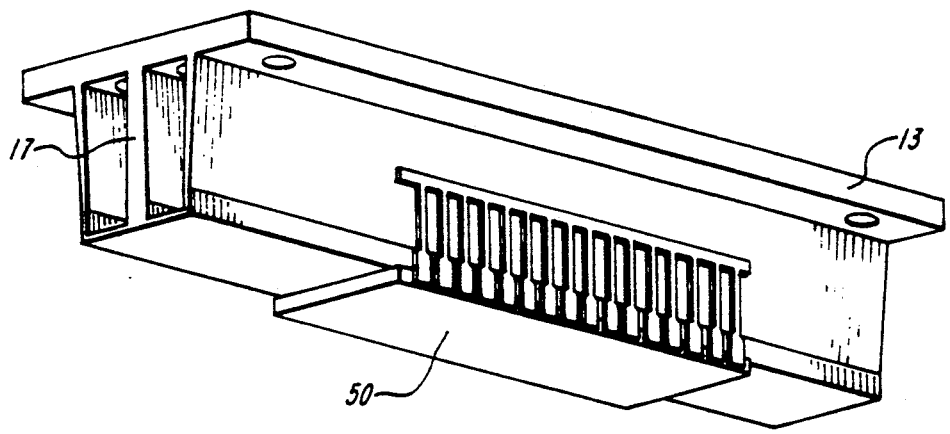
FIG. 6 is a perspective view of the removable fixture employed to apply bonding material to the surface between the leads of a dual-in-line package.

The removable fixture 11 may also serve to apply bonding material to the bottom surface of a leaded component such as a dual-in-line package 50, as seen in FIG. 6.

The invention is not limited by what has been particularly shown and described, except as indicated by the following appended claims.

What is claimed is:

1. An apparatus for applying bonding material onto a populated mounting surface, comprising:

removable fixture means including a holding frame, at least two vertical sides, and a conformed screening surface, said screening surface having a shape generally conforming to the shape of a targeted contact area of a populated mounting surface on which an electrical component is to be mounted and having a plurality of holes arranged generally in at least two rows, said rows being separated by a wall; and applicator means operative to push bonding material across said screening surface between and within said at least two vertical sides and to coerce the bonding material through said holes contained in said screening surface onto corresponding targeted contact areas of the populated mounting surface, whereby bonding material is deposited for mounting an electrical component by its individual contact elements.

2. The apparatus of claim 1 wherein said applicator means comprises a squeegee means.

3. The apparatus of claim 2 wherein the squeegee means comprises a polyurethane squeegee end.

4. The apparatus of claim 2 wherein the squeegee means comprises a flexible metal blade.

5. The apparatus of claim 1 wherein the thickness of said conformed screening surface and the size of said contained holes are provided according to a predetermined amount of solder to be deposited in the populated mounting surface.

6. An apparatus for applying bonding material onto a mounting surface having at least one obstruction, comprising:
   removable fixture means including a holding frame, at least two vertical sides, and a conformed screening surface, said screening surface having a shape generally conforming to the shape of a targeted contact area of the mounting surface on which an electrical component is to be mounted and having a plurality of holes arranged generally in at least two rows, said rows being separated by a wall; and
   applicator means operative to push bonding material across said screening surface between and within said at least two vertical sides and to coerce the bonding material through said holes contained in said screening surface onto corresponding targeted contact areas of the mounting surface, whereby bonding material is deposited for mounting an electrical component by its individual contact elements.

7. The apparatus of claim 6 wherein said applicator means comprises a squeegee means.

8. The apparatus of claim 7 wherein the squeegee means comprises a polyurethane squeegee end.

9. The apparatus of claim 6 wherein the thickness of said conformed screening surface and the size of said contained holes are provided according to a predetermined amount of solder paste to be deposited in the mounting surface.

10. An apparatus for applying bonding material onto a circuit board having at least one premounted electrical component thereon, comprising:
    removable fixture means including a holding frame, at least two vertical sides, and a conformed screening surface, said screening surface having a shape generally conforming to the shape of a targeted contact area of a circuit board on which an electrical component is to be mounted and having a plurality of holes arranged generally in at least two rows, said rows being separated by a wall; and
    applicator means operative to push bonding material across said screening surface between and within said at least two vertical sides and to coerce the bonding material through said holes contained in said screening surface onto corresponding targeted contact areas of the circuit board below, whereby bonding material is deposited for mounting an electrical component by its individual contact elements.

11. The apparatus of claim 10 wherein said applicator means comprises a squeegee means.

12. The apparatus of claim 11 wherein the squeegee means comprises a polyurethane squeegee end.

13. The apparatus of claim 10 wherein the thickness of said conformed screening surface and the size of said contained holes are provided according to a predetermined amount of solder paste to be deposited on the circuit board.

14. An apparatus for applying bonding material onto a circuit board having at least one premounted set of leads thereon, comprising:
    removable fixture means including a holding frame, at least two vertical sides, and a conformed screening surface, said screening surface having a shape generally conforming to the shape of a targeted contact area of a circuit board on which an electrical component is to be mounted and having a plurality of holes arranged generally in at least two rows, said rows being separated by a wall; and
    applicator means operative to push bonding material across said screening surface between and within said at least two vertical sides and to coerce the bonding material through said holes contained in said screening surface onto corresponding targeted contact areas of the circuit board below, whereby bonding material is deposited for mounting an electrical component by its individual contact elements.

15. The apparatus of claim 14 wherein said applicator means comprises a squeegee means.

16. The apparatus of claim 15 wherein the squeegee means comprises a polyurethane squeegee end.

17. The apparatus of claim 14 wherein the thickness of said conformed screening surface and the size of said contained holes are provided according to a predetermined amount of solder to be deposited on the circuit board.

* * * * *